United States Patent
Zou

(10) Patent No.: US 11,869,621 B2
(45) Date of Patent: Jan. 9, 2024

(54) STORAGE DEVICE HAVING MULTIPLE STORAGE DIES AND IDENTIFICATION METHOD

(71) Applicant: HuiZhou TCL Mobile Communication Co., Ltd., Guangdong (CN)

(72) Inventor: Gaoxiang Zou, Guangdong (CN)

(73) Assignee: HuiZhou TCL Mobile Communication Co., Ltd., HuiZhou (CN)

( * ) Notice: Subject to any disclaimer, the term of this patent is extended or adjusted under 35 U.S.C. 154(b) by 345 days.

(21) Appl. No.: 17/413,600

(22) PCT Filed: Nov. 21, 2019

(86) PCT No.: PCT/CN2019/119867
§ 371 (c)(1),
(2) Date: Jun. 14, 2021

(87) PCT Pub. No.: WO2020/125309
PCT Pub. Date: Jun. 25, 2020

(65) Prior Publication Data
US 2022/0044708 A1 Feb. 10, 2022

(30) Foreign Application Priority Data

Dec. 20, 2018 (CN) .......................... 201811564840.5

(51) Int. Cl.
| | |
|---|---|
| *G11C 5/02* | (2006.01) |
| *G11C 11/4072* | (2006.01) |
| *G11C 11/419* | (2006.01) |

(52) U.S. Cl.
CPC .......... *G11C 5/025* (2013.01); *G11C 11/4072* (2013.01); *G11C 11/419* (2013.01)

(58) Field of Classification Search
CPC .... G11C 5/025; G11C 11/4072; G11C 11/419
USPC ........................................................... 365/51
See application file for complete search history.

(56) References Cited

U.S. PATENT DOCUMENTS

| | | | |
|---|---|---|---|
| 9,761,559 B1 * | 9/2017 | Shih | ..................... H01L 25/0652 |
| 10,128,212 B2 | 11/2018 | Shih et al. | |
| 10,248,590 B2 | 4/2019 | Hsu et al. | |
| 2011/0215465 A1 | 9/2011 | Rahman et al. | |
| 2016/0092369 A1 | 3/2016 | Subramoney et al. | |

FOREIGN PATENT DOCUMENTS

| | | |
|---|---|---|
| CN | 101488462 | 7/2009 |
| CN | 101562168 | 10/2009 |
| CN | 203165882 | 8/2013 |
| CN | 103383663 | 11/2013 |
| CN | 105304130 | 2/2016 |
| CN | 107112043 | 8/2017 |
| CN | 107305890 | 10/2017 |
| CN | 109637564 | 4/2019 |

* cited by examiner

*Primary Examiner* — Huan Hoang

(57) ABSTRACT

A storage device having multiple storage dies is disclosed. The storage device comprises: a printed circuit board having a main surface, a plurality of universal input/output pins, placed on the main surface of the printed circuit board, and a plurality of random access storage dies, corresponding to the plurality of universal input/output pins, placed on the plurality of universal input/output pins.

7 Claims, 2 Drawing Sheets

STORAGE DEVICE HAVING MULTIPLE STORAGE DIES AND IDENTIFICATION METHOD

RELATED APPLICATIONS

This application is a National Phase of PCT Patent Application No. PCT/CN2019/119867 having International filing date of Nov. 21, 2019, which claims the benefit of priority of Chinese Patent Application No. 201811564840.5 filed on Dec. 20, 2018. The contents of the above applications are all incorporated by reference as if fully set forth herein in their entirety.

FIELD AND BACKGROUND OF THE INVENTION

The present invention relates to an embedded equipment, and more particularly, to a storage device having multiple storage dies and an identification method.

Cell phones, tablets or other portable devices become thinner and smaller and thus make it more difficult for the manufacturer to assemble and package these devices. In order to save space, it is more important for the manufactures to put multiple chips into a single package. Integration and package of RAMs (Random Access Memory) and ROMs (Read-Only Memory) are part of the focus point. As the progress of the technology, it becomes possible to integrate the RAMs and ROMs. Furthermore, it is even possible to embed a control chip such that the cost and manufacturing difficulty of the cell phone could be reduced.

In the past two years, because the price of the internal memory and the demands of the smart phones are higher and the price of the eMCP (embedded multi-chip package) is higher, the discrete DRAM and the discrete Flash memory are used to replace the eMCP to save the cost. However, the manufacturer often uses dies manufactured by the same foundry. This may introduce the compatibility issue of the DRAM and the reduction of the coding maintainability and increase the development difficulty.

SUMMARY OF THE INVENTION

One objective of an embodiment of the present invention is to provide a storage device having multiple storage dies and an identification method such that the storage dies in an embedded equipment could be identified through a CPU.

In this way, the manufacturer could easily save the cost and procure the devices in the manufacturing process. In addition, this could be widely used and thus reduce the maintenance cost.

According to an embodiment of the present invention, a storage device having multiple storage dies is disclosed. The storage device comprises: a printed circuit board, having a main surface; a plurality of universal input/output pins, placed on the main surface of the printed circuit board; and a plurality of random access storage dies, corresponding to the plurality of universal input/output pins, placed on the plurality of universal input/output pins.

In some embodiments of the present disclosure, the number of the universal I/O pins is not less than 2. There are at least two universal I/O pins placed on the main surface of the PCB.

In some embodiments of the present disclosure, the universal I/O pins are electrically connected to each other.

In some embodiments of the present disclosure, the number of the random access storage dies is corresponding to the number of the universal I/O pins. At least two random access storage dies are provided and placed on the universal I/O pins.

In some embodiments of the present disclosure, the random access storage dies have the same material removal rate.

In some embodiments of the present disclosure, the random access storage dies comprise dies having the same memory timing, dies having different memory dies, or any combination.

According to an embodiment of the present invention, an identification method used in an embedded equipment having a storage device having multiple storage dies is disclosed. The embedded equipment comprises a processing unit and a synchronous dynamic random access memory device. The identification method comprising: establishing a memory timing look-up table and storing the memory timing look-up table in the synchronous dynamic random access memory device; establishing a dynamic random access memory type mapping table, and storing the dynamic random access memory type mapping table in the synchronous dynamic random access memory device; utilizing the processing unit to check a number of universal input/output pins of the storage device having multiple storage dies; utilizing the processing unit to preload and initiate voltage levels of the universal input/output pins; utilizing the processing unit to obtain a composite voltage level information of the universal input/output pins and obtaining a dynamic random access memory type through the dynamic random access memory type mapping table; utilizing the processing unit to obtain a memory timing number of a random access storage device through the memory timing look-up table according to the dynamic random access memory type; and utilizing the processing unit to initialize the random access storage device according to the memory timing number to complete an identification operation.

In this embodiment, the random access storage dies comprise dies having the same memory timing, dies having different memory dies, or any combination.

In some embodiments of the present disclosure, the processing unit is a central processing unit (CPU).

The processing unit could read a corresponding test signal through executing a program to obtain the number of the universal I/O pins.

The processing unit could determine whether the corresponding dynamic random access storage device is normal by checking whether the composite voltage level information of the universal I/O pins has a predicted response.

In some embodiments of the present disclosure, the memory timing look-up table is established through a memory timing of the dynamic random access memory type. After the processing unit updates the memory timing look-up table, the memory timing look-up table is stored in the SDRAM device.

The dynamic random access memory type mapping table is established according to a relationship between the composite voltage level information of the universal input/output pins and the dynamic random access memory device. After the processing unit updates the dynamic random access memory type mapping table, the dynamic random access memory type mapping table is stored in the SDRAM device.

The storage device having multiple storage dies have a plurality of I/O pins and the storage dies are placed on the universal input/output pins. The number of the storage dies is corresponding to the number of the I/O pins.

The processing unit could initiate the voltage levels of the universal input/output pins to make the voltage levels being with 0 dB or 0 Np.

In some embodiments of the present disclosure, the random access storage dies have the same material removal rate.

In some embodiments, the plurality of random access storage dies comprise dies having a same memory timing, dies having different memory dies, or any combination.

According to an embodiment of the present invention, a storage medium is disclosed. The storage medium stores a plurality of instructions, configured to be executed by a processing unit to perform the above-mentioned identification method.

In contrast to the conventional art, a storage device having multiple storage dies and an identification method of an embodiment of the present invention could have the following effects: the storage dies, which may be provided by different providers and have different memory timings but manufactured by the same foundry and have the same material remover rate, could be identified through a CPU.

In this way, the manufacture could easily procure the dies and save the cost during manufacturing process. This application could be widely used and reduce the maintenance cost.

DESCRIPTION OF SPECIFIC EMBODIMENTS OF THE INVENTION

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention.

Figure 1:
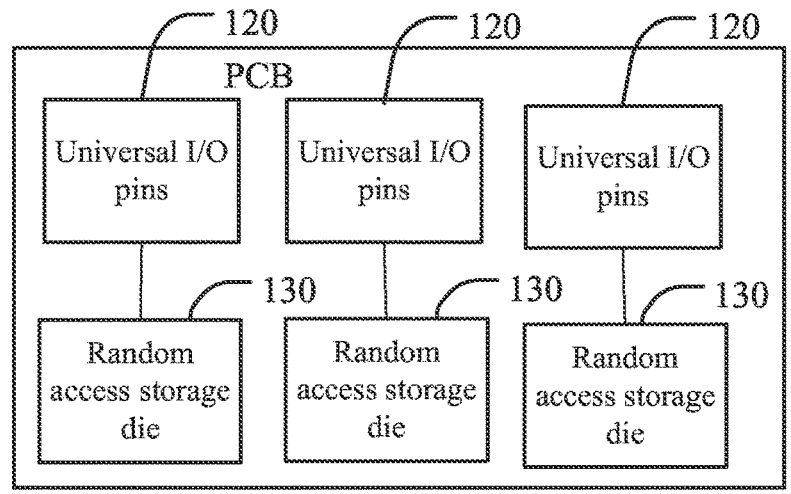
FIG. 1 is a diagram of a storage device having multiple storage dies according to an embodiment of the present invention.

Please refer to FIG. 1. FIG. 1 is a diagram of a storage device having multiple storage dies according to an embodiment of the present invention. The storage device having multiple storage dies comprises: a printed circuit board (PCB) 110, a plurality of universal input/output (I/O) pins 120, and a plurality of random access storage dies 130. The PCB 110 has a main surface, the universal I/O pins 120 are placed on the main surface of the PCB 110. The random access storage dies 130 correspond to the number of the universal I/O pins 120 and are placed on the I/O pins 120.

The number of the universal I/O pins is not less than 2. In other words, there are at least two universal I/O pins 120 placed on the main surface of the PCB 110.

In addition, in this embodiment, the universal I/O pins 120 are electrically connected to each other.

The number of the random access storage dies 130 is corresponding to the number of the universal I/O pins 120. Therefore, at least two random access storage dies 130 are provided and placed on the universal I/O pins 120.

In this embodiment, the random access storage dies 130 have the same material removal rate.

In this embodiment, the random access storage dies 130 comprise dies having the same memory timing, dies having different memory dies, or any combination.

The storage device having multiple storage dies could be a random access memory (RAM), a dynamic random access memory (DRAM), a synchronous dynamic random access memory (SDRAM), and/or a static random access memory (SRAM).

Figure 2:
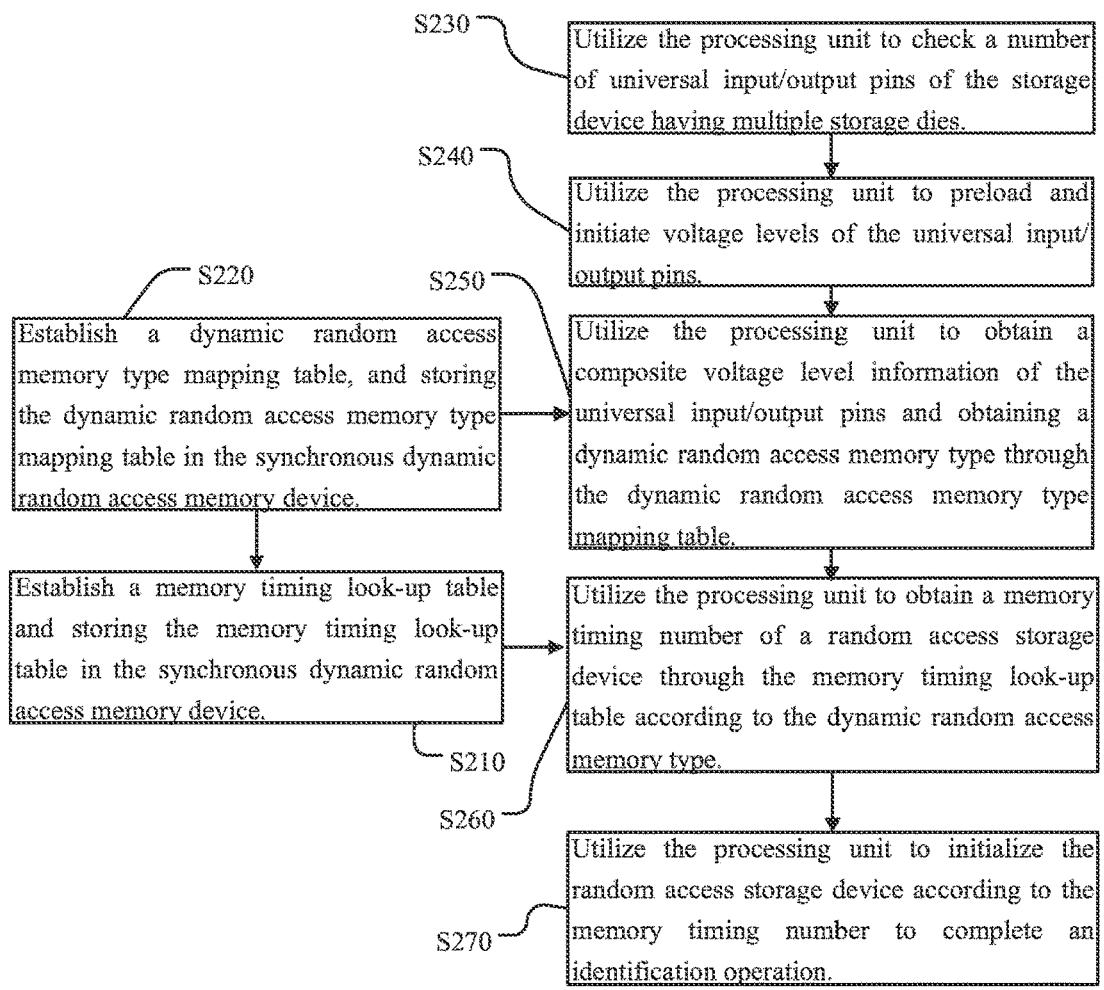
FIG. 2 is a flow chart of an identification method of a storage device having multiple storage dies according to an embodiment of the present invention.

Please refer to FIG. 2. FIG. 2 is a flow chart of an identification method of a storage device having multiple storage dies according to an embodiment of the present invention. The identification method is used in an embedded equipment having a storage device having multiple storage dies. The embedded equipment comprises a processing unit and a synchronous dynamic random access memory (SDRAM) device. The identification method comprises:

Step S210: Establish a memory timing look-up table and storing the memory timing look-up table in the synchronous dynamic random access memory device.

Step S220: Establish a dynamic random access memory type mapping table, and storing the dynamic random access memory type mapping table in the synchronous dynamic random access memory device.

Step S230: Utilize the processing unit to check a number of universal input/output pins of the storage device having multiple storage dies.

Step S240: Utilize the processing unit to preload and initiate voltage levels of the universal input/output pins.

Step S250: Utilize the processing unit to obtain a composite voltage level information of the universal input/output pins and obtaining a dynamic random access memory type through the dynamic random access memory type mapping table.

Step S260: Utilize the processing unit to obtain a memory timing number of a random access storage device through the memory timing look-up table according to the dynamic random access memory type.

Step S270: Utilize the processing unit to initialize the random access storage device according to the memory timing number to complete an identification operation.

The number of the universal I/O pins is not less than 2. In other words, there are at least two universal I/O pins placed on the main surface of the PCB.

In this embodiment, the number of the random access storage dies equals to the number of the universal I/O pins. At least two random access storage dies are on the universal I/O pins which are placed on the main surface of the PCB In this embodiment, the random access storage dies have the same material removal rate.

In this embodiment, the random access storage dies comprise dies having the same memory timing, dies having different memory dies, or any combination.

The processing unit is a central processing unit (CPU).

The processing unit could read a corresponding test signal through executing a program to obtain the number of the universal I/O pins.

The processing unit could determine whether the corresponding dynamic random access storage device is normal by checking whether the composite voltage level information of the universal I/O pins has a predicted response.

The memory timing look-up table is established through a memory timing of the dynamic random access memory type.

The dynamic random access memory type mapping table is established according to a relationship between the composite voltage level information of the universal input/output pins and the dynamic random access memory device.

The storage device having multiple storage dies have a plurality of I/O pins and the storage dies are placed on the universal input/output pins. Here, the number of the storage dies is corresponding to the number of the I/O pins.

The processing unit could initiate the voltage levels of the universal input/output pins to make the voltage levels being with 0 dB or 0 Np.

After the processing unit updates the memory timing look-up table, the memory timing look-up table is stored in the SDRAM device.

After the processing unit updates the dynamic random access memory type mapping table, the dynamic random access memory type mapping table is stored in the SDRAM device.

Figure 3:
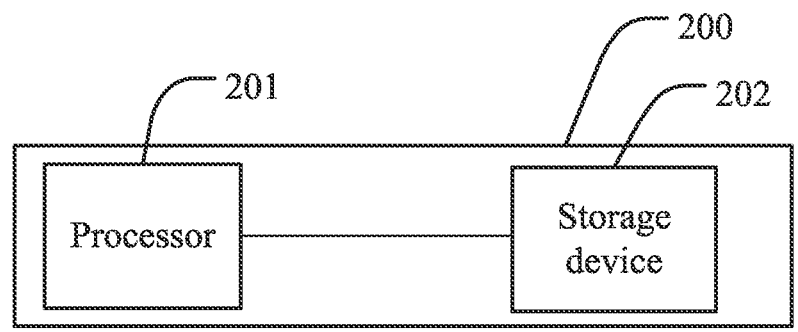
FIG. 3 is a diagram of a terminal equipment according to an embodiment of the present invention.

Please refer to FIG. 3. FIG. 3 is a diagram of a terminal equipment according to an embodiment of the present invention. As shown in FIG. 3, a terminal equipment 200 is provided. The terminal equipment 200 could be a cell phone, a tablet, a computer, or etc. The terminal equipment 200 comprises a processor 201 and a storage device 202. The processor 201 is electrically connected to the storage device 202.

The processor 201 is a control center of the terminal equipment and is connected to the components of the terminal equipment 200 through buses and ports. The processor 201 could execute or load the programs stored in the storage device 202 and load the data stored in the storage device 202 to perform the functions and process the data of the terminal equipment 200. In this way, the processor 201 could control and monitor the terminal equipment 200.

In this embodiment, the terminal equipment 200 has multiple storage sections. The storage sections comprise a system section and a target section. The processor 201 of the terminal equipment 200 could load the instructions of one or more applications to the storage device 202 and execute the applications stored in the storage device 202 to perform all kinds of functions according to the following steps:

establishing a memory timing look-up table and storing the memory timing look-up table in the synchronous dynamic random access memory device;

establishing a dynamic random access memory type mapping table, and storing the dynamic random access memory type mapping table in the synchronous dynamic random access memory device;

utilizing the processing unit to check a number of universal input/output pins of the storage device having multiple storage dies;

utilizing the processing unit to preload and initiate voltage levels of the universal input/output pins;

utilizing the processing unit to obtain a composite voltage level information of the universal input/output pins and obtaining a dynamic random access memory type through the dynamic random access memory type mapping table;

utilizing the processing unit to obtain a memory timing number of a random access storage device through the memory timing look-up table according to the dynamic random access memory type; and utilizing the processing unit to initialize the random access storage device according to the memory timing number to complete an identification operation.

Figure 4:
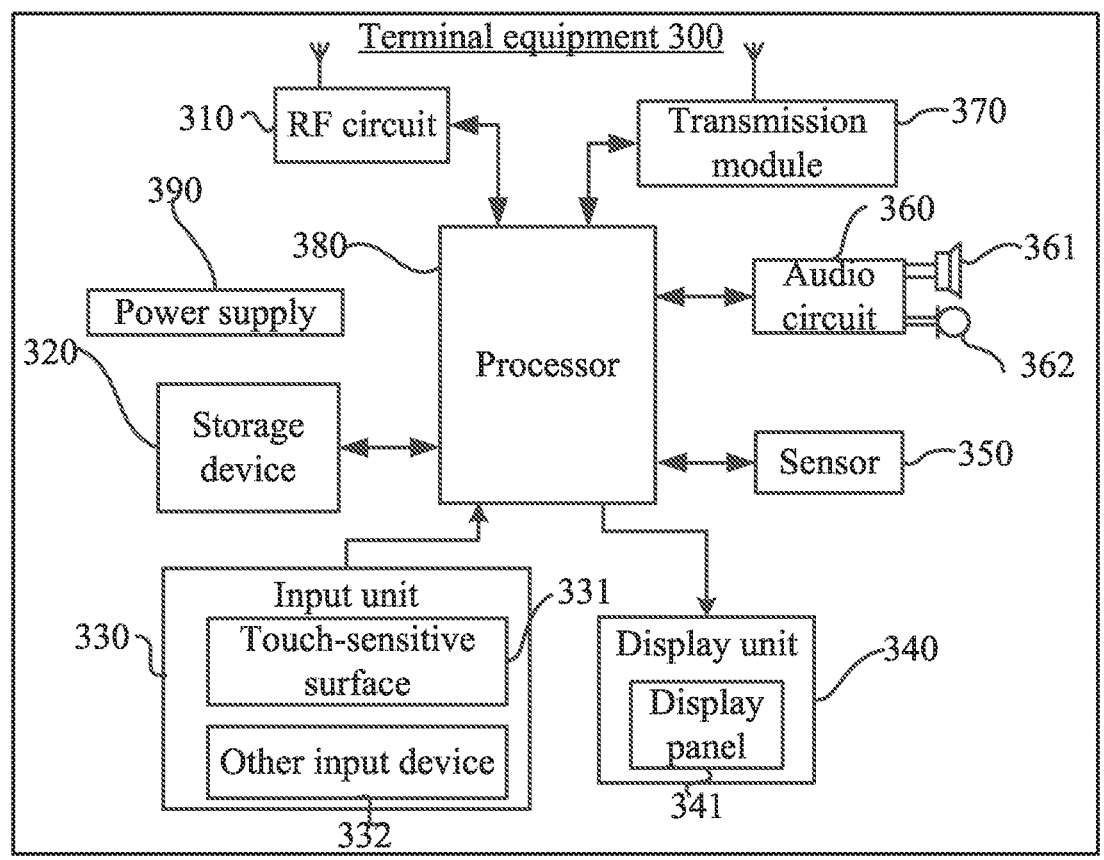
FIG. 4 is a diagram showing more detailed components of a terminal equipment according to an embodiment of the present invention.

Please refer to FIG. 4. FIG. 4 is a diagram showing more detailed components of a terminal equipment according to an embodiment of the present invention. As shown in FIG. 4, the terminal equipment 300 could be used to implement the above-mentioned identification method of the storage device having multiple storage dies. The terminal equipment 300 could be a cell phone or a tablet.

The RF circuit 310 may be configured to receive and send a signal during an information receiving and sending process or a conversation process. Specifically, after receiving downlink information from a base station, the RF circuit 310 delivers the downlink information to one or more processors 380 for processing, and sends related uplink data to the base station. Generally, the RF circuit 310 includes, but is not limited to, an antenna, at least one amplifier, a tuner, one or more oscillators, a subscriber identity module (SIM) card, a transceiver, a coupler, a low noise amplifier (LNA), and a duplexer. In addition, the RF circuit 310 may also communicate with a network and another device by wireless communication. The wireless communication may use any communications standard or protocol, which includes, but is not limited to, a Global System for Mobile communications (GSM), an Enhanced Data GSM Environment (EDGE), a Wideband Code Division Multiple Access (WCDMA), a Code Division Access (CDMA), a Time Division Multiple Access (TDMA), a Wireless Fidelity (Wi-Fi) such as IEEE 802.11a, IEEE 802.11b, IEEE802.11g and IEEE 802.11n, a Voice over Internet Protocol (VoIP), a Worldwide Interoperability for Microwave Access (Wi-Max), any other protocols for e-mail, instant communication and short message, and the like.

The storage device 320 may be configured to store a software program and module. The processor 380 runs the software program and module stored in the storage device 320, to implement various functional applications and data processing. The storage device 320 may mainly include a program storage area and a data storage area. The program storage area may store an operating system, an application program required by at least one function (such as a sound playback function and an image display function), and the like. The data storage area may store data (such as audio data and an address book) created according to use of the mobile terminal, and the like. In addition, the storage device 320 may include a high speed random access memory, and may also include a non-volatile memory, such as at least one magnetic disk storage device, a flash memory device, or another volatile solid-state storage device. Correspondingly, the storage device 320 may further include a memory controller, so that the processor 380 and the input unit 330 access the storage device 320.

The input unit 330 may be configured to receive input digit or character information, and generate keyboard, mouse, joystick, optical, or track ball signal input related to the user setting and function control. Specifically, the input unit 330 may include a touch-sensitive surface 331 and other input device 332. The touch-sensitive surface 331 may also be referred to as a touch screen or a touch panel, and may collect a touch operation of a user on or near the touch-sensitive surface (such as an operation of a user on or near the touch-sensitive surface by using any suitable object or attachment, such as a finger or a stylus), and drive a corresponding connection apparatus according to a preset program. Optionally, the touch-sensitive surface may include two parts: a touch detection apparatus and a touch controller. The touch detection apparatus detects a touch position of the user, detects a signal generated by the touch operation, and transfers the signal to the touch controller. The touch controller receives the touch information from the touch detection apparatus, converts the touch information into touch point coordinates, and sends the touch point coordinates to the processor 380. Moreover, the touch controller can receive and execute a command sent from the processor 380. In addition, the touch-sensitive surface may be implemented by using various types, such as a resistive type, a capacitance type, an infrared type, and a surface sound wave type. In addition to the touch-sensitive surface, the input unit 330 may further include the another input device. Specifically, the another input device may include, but is not limited to, one or more of a physical keyboard, a functional key (such as a volume control key or a switch key), a track ball, a mouse, and a joystick.

The display unit 340 may be configured to display information input by the user or information provided for the user, and various graphical user ports of the mobile terminal. The graphical user ports may be formed by a graph, a text, an icon, a video, and any combination thereof. The display unit 340 may include a display panel 341. Optionally, the display panel may be configured by using a liquid crystal display (LCD), an organic light-emitting diode (OLED), or the like. Further, the touch-sensitive surface may cover the display panel. After detecting a touch operation on or near the touch-sensitive surface, the touch-sensitive surface transfers the touch operation to the processor 380, so as to determine a type of a touch event. Then, the processor 380 provides corresponding visual output on the display panel according to the type of the touch event. Although, in FIG. 4, the touch-sensitive surface and the display panel are used as two separate parts to implement input and output functions, in some embodiments, the touch-sensitive surface and the display panel may be integrated to implement the input and output functions.

The terminal equipment 300 may further include at least one sensor 350, such as an optical sensor, a motion sensor, and other sensors. Specifically, the optical sensor may include an ambient light sensor and a proximity sensor. The ambient light sensor may adjust luminance of the display panel 341 according to brightness of the ambient light. The proximity sensor may switch off the display panel 341 and/or backlight when the terminal equipment 300 is moved to the ear. As one type of motion sensor, a gravity acceleration sensor may detect magnitude of accelerations at various directions (which generally are triaxial), may detect magnitude and a direction of the gravity when static, and may be configured to identify an application of a mobile phone attitude (such as switching between horizontal and vertical screens, a related game, and attitude calibration of a magnetometer), a related function of vibration identification (such as a pedometer and a knock). Other sensors, such as a gyroscope, a barometer, a hygrometer, a thermometer, and an infrared sensor, which may be configured in the terminal equipment 300 are not further described herein.

The audio circuit 360, a loudspeaker 361, and a microphone 362 may provide audio interfaces between the user and the terminal equipment 300. The audio circuit 360 may transmit, to the loudspeaker 361, a received electric signal converted from received audio data. The loudspeaker 361 converts the electric signal into a sound signal for output. On the other hand, the microphone 362 converts a collected sound signal into an electric signal. The audio circuit 360 receives the electric signal and converts the electric signal into audio data, and outputs the audio data to the processor 380 for processing. Then, the processor 380 sends the audio data to, for example, another terminal by using the RF circuit 310, or outputs the audio data to the storage device 320 for further processing. The audio circuit 360 may further include an earplug jack, so as to provide communication between a peripheral earphone and the terminal equipment 300.

The terminal equipment 300 may help, by using the transmission module 370 (e.g. Wi-Fi module), a user to receive and send an e-mail, browse a webpage, and access stream media, and the like, which provides wireless broadband Internet access for the user. Although FIG. 5 shows the transmission module 370, it may be understood that, the wireless communications unit is not a necessary component of the terminal equipment 300, and can be ignored according to demands without changing the scope of the essence of the present disclosure.

The processor 380 is a control center of the terminal equipment 300, and connects various parts of the terminal by using various interfaces and lines. By running or executing the software program and/or module stored in the storage device 320, and invoking data stored in the storage device 320, the processor 380 performs various functions and data processing of the terminal equipment 300, thereby performing overall monitoring on the mobile phone. Optionally, the processor 380 may include one or more processing cores. Preferably, the processor 380 may integrate an application processor and a modem. The application processor mainly processes an operating system, a user interface, an application program, and the like. The modem mainly processes wireless communication. It may be understood that, the foregoing modem may not be integrated into the processor 380.

The terminal equipment 300 further includes the power supply 390 (such as a battery) for supplying power to the components. Preferably, the power supply may be logically connected to the processor 380 by using a power supply management system, thereby implementing functions, such as charging, discharging, and power consumption management, by using the power supply management system. The power supply 390 may further include any component, such as one or more direct current or alternate current power supplies, a re-charging system, a power supply fault detection circuit, a power supply converter or an inverter, and a power supply state indicator.

The mobile terminal equipment 300 could further comprise a camera (such as front camera or back camera) or a Bluetooth module. In this embodiment, the display unit of the mobile terminal is a touch panel. The mobile terminal further comprises a storage device and one or more programs (instructions) stored in the storage device. These programs (instructions) are executed by one or more processors to perform following operations:

establishing a memory timing look-up table and storing the memory timing look-up table in the synchronous dynamic random access memory device;

establishing a dynamic random access memory type mapping table, and storing the dynamic random access memory type mapping table in the synchronous dynamic random access memory device;

utilizing the processing unit to check a number of universal input/output pins of the storage device having multiple storage dies;

utilizing the processing unit to preload and initiate voltage levels of the universal input/output pins;

utilizing the processing unit to obtain a composite voltage level information of the universal input/output pins and obtaining a dynamic random access memory type through the dynamic random access memory type mapping table;

utilizing the processing unit to obtain a memory timing number of a random access storage device through the memory timing look-up table according to the dynamic random access memory type; and utilizing the processing unit to initialize the random access storage device according to the memory timing number to complete an identification operation.

In addition, the functional units in the various embodiments of the present disclosure may be integrated into a processing module, or each unit may be physically present individually, or two or more units may be integrated into one module. The above integrated module may be implemented by using hardware, or may be implemented by using a software function module. The integrated module may be stored in a computer readable storage medium if it is implemented by a software function module and is sold or used as a standalone product.

A person having ordinary skills in the art could understand that a part or all of the steps of the identification method could be completed through executing instructions or executing instruction to control related hardware. The instructions could be stored in a storage medium and executed by a processor. Accordingly, a storage medium is provided according to an embodiment of the present invention. The storage medium stores a plurality of instruction. These instructions could be loaded by a processor to perform any of the above-mentioned steps of the identification method.

The above-mentioned storage medium may be a read-only memory, a random access memory (RAM), a magnetic disk, or an optical disk.

Because the instructions stored in the storage medium could be executed to perform any of the above-mentioned steps of the identification method, the advantages/effects of the storage device could be achieved as well. The related details and operations have been illustrated in the above embodiments and thus omitted here.

In the description of this specification, the description of the terms "one embodiment", "some embodiments", "examples", "specific examples", or "some examples", and the like, means to refer to the specific feature, structure, material or characteristic described in connection with the embodiments or examples being included in at least one embodiment or example of the present disclosure. It will be further understood that the terms "comprises" and/or "comprising," when used in this specification, specify the presence of stated features, products, steps, operations, elements, and/or components, but do not preclude the presence or addition of one or more other features, products, steps, operations, elements, components, and/or groups thereof.

Above are embodiments of the present invention, which does not limit the scope of the present invention. Any modifications, equivalent replacements or improvements within the spirit and principles of the embodiment described above should be covered by the protected scope of the invention.

What is claimed is:

1. An identification method, used in an embedded equipment having a storage device having multiple storage dies, the embedded equipment comprising a processing unit and a synchronous dynamic random access memory device, the identification method comprising:

establishing a memory timing look-up table and storing the memory timing look-up table in the synchronous dynamic random access memory device;

establishing a dynamic random access memory type mapping table, and storing the dynamic random access memory type mapping table in the synchronous dynamic random access memory device;

utilizing the processing unit to check a number of universal input/output pins of the storage device having multiple storage dies;

utilizing the processing unit to preload and initiate voltage levels of the universal input/output pins;

utilizing the processing unit to obtain a composite voltage level information of the universal input/output pins and obtaining a dynamic random access memory type through the dynamic random access memory type mapping table;

utilizing the processing unit to obtain a memory timing number of a random access storage device through the memory timing look-up table according to the dynamic random access memory type; and utilizing the processing unit to initialize the random access storage device according to the memory timing number to complete an identification operation.

2. The identification method of claim 1, wherein the step of establishing the memory timing look-up table and storing the memory timing look-up table in the synchronous dynamic random access memory device comprises:

establishing the memory timing look-up table through a memory timing of the dynamic random access memory type.

3. The identification method of claim 1, wherein the step of establishing the dynamic random access memory type mapping table and storing the dynamic random access memory type mapping table in the synchronous dynamic random access memory device comprises:

establishing the dynamic random access memory type mapping table according to a relationship between the composite voltage level information of the universal input/output pins and the dynamic random access memory device.

4. The identification method of claim 1, wherein the step of utilizing the processing unit to check a number of universal input/output pins of the storage device comprises:

placing the number of the storage dies on the universal input/output pins.

5. The identification method of claim 1, wherein the step of utilizing the processing unit to preload and initiate voltage levels of the universal input/output pins comprising:

utilizing the processing unit to initiate the voltage levels of the universal input/output pins to make the voltage levels being with 0 dB or 0 Np.

6. The identification method of claim 1, wherein the storage device is a dynamic random access memory (DRAM).

7. The identification method of claim 1, wherein the storage device is a static random access memory (SRAM).

* * * * *